(12) United States Patent
Andreev et al.

(10) Patent No.: US 6,845,495 B2
(45) Date of Patent: Jan. 18, 2005

(54) MULTIDIRECTIONAL ROUTER

(75) Inventors: Alexandre E. Andreev, San Jose, CA (US); Elyar E. Gasanov, Moscow (RU); Ranko Scepanovic, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 474 days.

(21) Appl. No.: 10/027,642

(22) Filed: Dec. 20, 2001

(65) Prior Publication Data

US 2003/0121017 A1 Jun. 26, 2003

(51) Int. Cl.[7] ............................................. G06F 17/50
(52) U.S. Cl. ........................................ 716/14; 716/12
(58) Field of Search .................................... 716/12–14

(56) References Cited

U.S. PATENT DOCUMENTS

| 5,340,772 | A | 8/1994 | Rosotker ..................... 437/226 |
| 5,493,508 | A | 2/1996 | Dangelo et al. |
| 5,532,934 | A | 7/1996 | Rostoker ..................... 364/488 |
| 5,822,214 | A | 10/1998 | Rostoker et al. ............. 364/488 |
| 6,230,306 | B1 * | 5/2001 | Raspopovic et al. .......... 716/13 |
| 6,317,864 | B1 | 11/2001 | Kikuchi et al. ................ 716/11 |

OTHER PUBLICATIONS

"Standard–Cell Design", M.J.S. Smith, ASIC Library Design, Addison–Wesley, 1997, Chapter 3, p. 150.

* cited by examiner

Primary Examiner—Stacy A. Whitmore
(74) Attorney, Agent, or Firm—Suiter West PC LLO

(57) ABSTRACT

The present invention is directed to a system and method for providing multidirectional routing. The present invention may provide an arbitrary number of routing layers and an arbitrary direction on each of those layers to provide a smaller die size and to reduce power consumption by providing more flexibility for net routing directions.

30 Claims, 6 Drawing Sheets

US 6,845,495 B2

MULTIDIRECTIONAL ROUTER

FIELD OF THE INVENTION

The present invention generally relates to the field of integrated circuit design, and particularly to a system and method of providing multidirectional routing.

BACKGROUND OF THE INVENTION

An integrated circuit chip (hereafter referred to as an "IC" or a "chip") comprises cells and connections between the cells formed on a surface of a semiconductor substrate. The IC may include a large number of cells and require complex connections between the cells.

A cell is a group of one or more circuit elements such as transistors, capacitors, and other basic circuit elements grouped to perform a function. Each of the cells of an IC may have one or more pins, each of which, in turn, may be connected to one or more other pins of the IC by wires. The wires connecting the pins of the IC are also formed on the surface of the chip.

A net is a set of two or more pins that must be connected. Because a typical chip has thousands, tens of thousands, or hundreds of thousands of pins that must be connected in various combinations, the chip also includes definitions of thousands, tens of thousands, or hundreds of thousands of nets, or sets of pins. All the pins of a net must be connected. The number of the nets for a chip is typically in the same order as the order of the number of cells on that chip. Commonly, a majority of the nets include only two pins to be connected; however, many nets comprise three or more pins. Some nets may include hundreds of pins to be connected. A netlist is a list of nets for a chip.

Microelectronic integrated circuits include a large number of electronic components that are fabricated by layering several different materials on a silicon base or wafer. The design of an integrated circuit transforms a circuit description into a geometric description, which is known as a layout. A layout includes a set of planar geometric shapes in several layers.

Routing between the components of the chip is typically done utilizing Manhattan routing, in which X and Y Cartesian coordinates are used when laying out lines on silicon. However, such a routing method may limit the chip density, and thus the speed of the chip.

Therefore, it would be desirable to provide a system and method that may employ non-Manhattan routing through the provision of routing process capable of utilization of arbitrary angles.

SUMMARY OF THE INVENTION

Accordingly, the present invention is directed to a system and method for providing multidirectional routing. The present invention may provide an arbitrary number of routing layers and an arbitrary direction on each of those layers to provide a smaller die size and to reduce power consumption by providing more flexibility for net routing directions.

In a first aspect of the present invention a method for routing a multi-layered integrated circuit wherein arbitrary routing directions may be supported on an arbitrary number of layers of the integrated circuit includes receiving parameters for an integrated circuit having n layers, wherein n is at least two. A routing graph is constructed for layers of the integrated circuit, the levels partitioned into tiles, wherein at least one edge is provided to join a first tile and a second tile in the routing graph, the tiles positioned generally corresponding to a layer grid line of the level. Routing is then performed based on the routing graph.

In a second aspect of the present invention, a method for routing a multi-layered integrated circuit includes receiving parameters for an integrated circuit having n layers, wherein n is at least two. A routing graph is constructed for a level k of the n layers of the integrated circuit. The k level is partitioned into k-level tiles, wherein at least one edge is provided to join a first tile and a second tile in the k level routing graph. Capacities of the at least one edge joining the first tile and the second tile are calculated, the edge at least one of regular and normal. Occupancies are added based on previous level net routing (k+1) and penalties of edges calculated. Nets are then routed based on the routing graph, calculated capacities and added occupancies.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Referring generally now to FIGS. 1 through 5, exemplary embodiments of the present invention are shown. By providing more flexibility for net routing directions, a smaller die size and reduced power consumption may be achieved. Traditionally, nets on a chip were routed using two directions: vertical and horizontal. For each direction, one or more layers were used. By providing a general routing solution of the present invention, an arbitrary number of routing layers and an arbitrary direction on each of those layers may be utilized to provide greater flexibility for net routing directions.

Thus, the present invention provides a method and apparatus for routing multiplayer integrated circuit chips. For instance, suppose an integrated circuit chip (chip) has $n \leq 2$ layers. For each layer, the plane of the layer is divided by parallel lines (y cos $a_1$)+(x sin $a_1$)=j $d_i$, j=0, ±1, ±2, ..., where $a_i$ is an inclination of the lines, $d_1$, is the distance between neighboring lines. For example, if $a_i=\pi/2$, then the plane is divided by vertical lines with step $d_i$, These lines may be referred to as layer grid lines and wires on this layer are placed along those lines.

For example, if n=4, $a_1=\pi/2$, $d_1=1400$, $a_2=0$, $d_2=1200$, $a_3=\pi/3$, $d_3=1400$, $a_4=5\pi/7$, $d_4=1200$, which means that the chip has 4 layers, the first layer containing vertical grid lines with step $d_1=1400$, the second layer contains horizontal grid lines with step $d_2=1200$, and for the third and fourth layer, grid lines having inclination $a_3=\pi/3$ and $a_4=5\pi/7$, and the distance between neighbor lines $d_3=1400$ and $d_4=1200$ respectively. A via may be provided for wire connection between the different layers.

Figure 1:
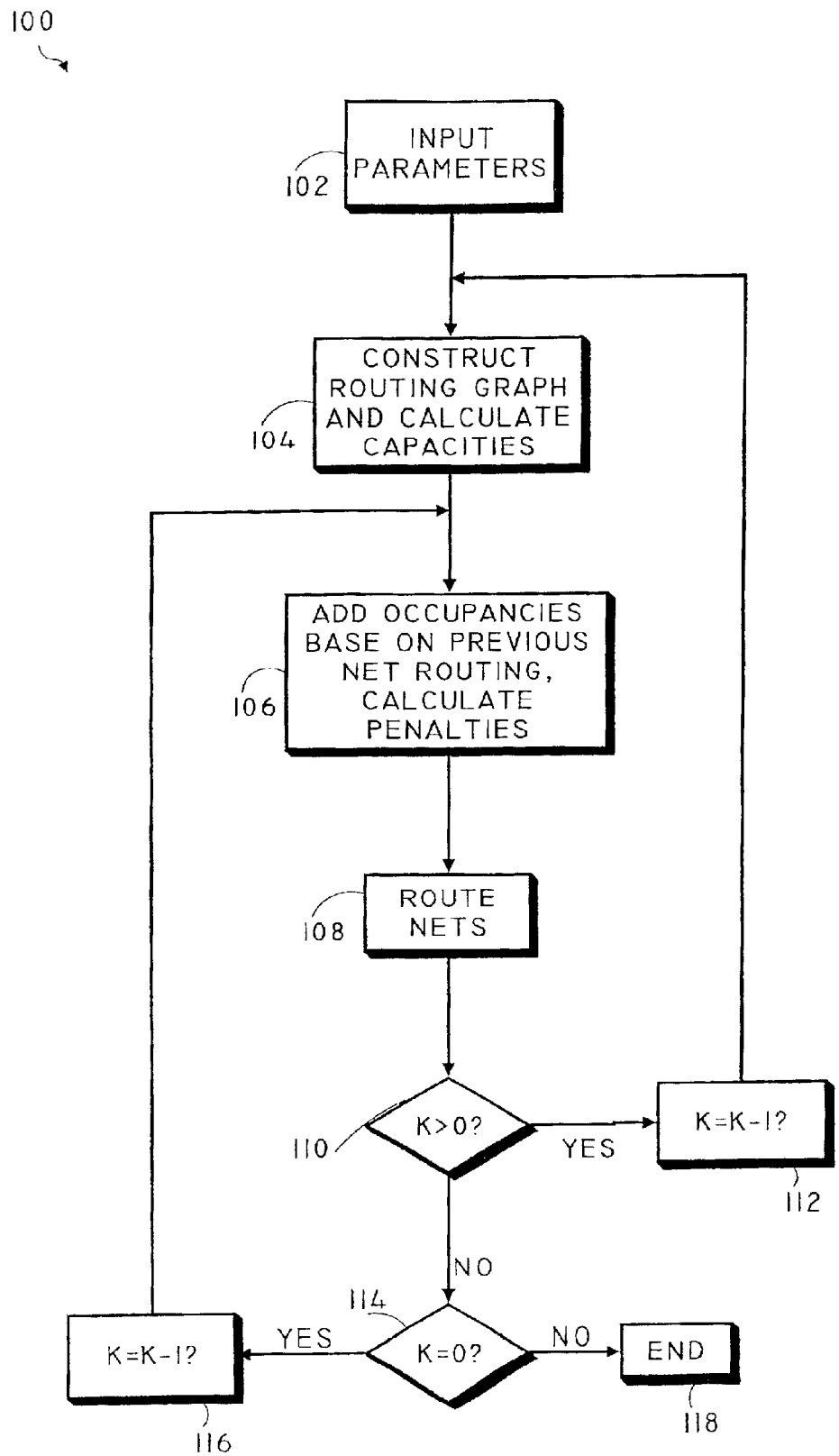
FIG. 1 is a flow diagram of an exemplary method of the present invention wherein a procedure for routing an integrated circuit having multiple layers is shown suitable utilizing any arbitrary angle.

Referring now to FIG. 1, an exemplary method 100 of the present invention is shown wherein routing for a multi-layer integrated circuit utilizing arbitrary angles on the layers of the integrated circuit is provided. First, parameters of the integrated circuit are input 102. For instance, a number of layers and the like desired on the integrated circuit may be received. A routing graph is constructed and capacities of routes are calculated 104. For instance, a routing graph may be obtained for a first layer. Available occupancies based on previous net routing and the corresponding penalties are calculated 106. Nets are then routed 108 through a variety of methods, which will be discussed later.

If k>zero 110, the constructing 104, adding/calculating 106, and routing 108 operational steps are repeated after one is subtracted from k 112. If k is equal to zero 114, the adding/calculating 106, and routing 110 operational steps are repeated after one is subtracted from k 116. If k is less than zero 118, legal net routing is obtained.

Figure 2:
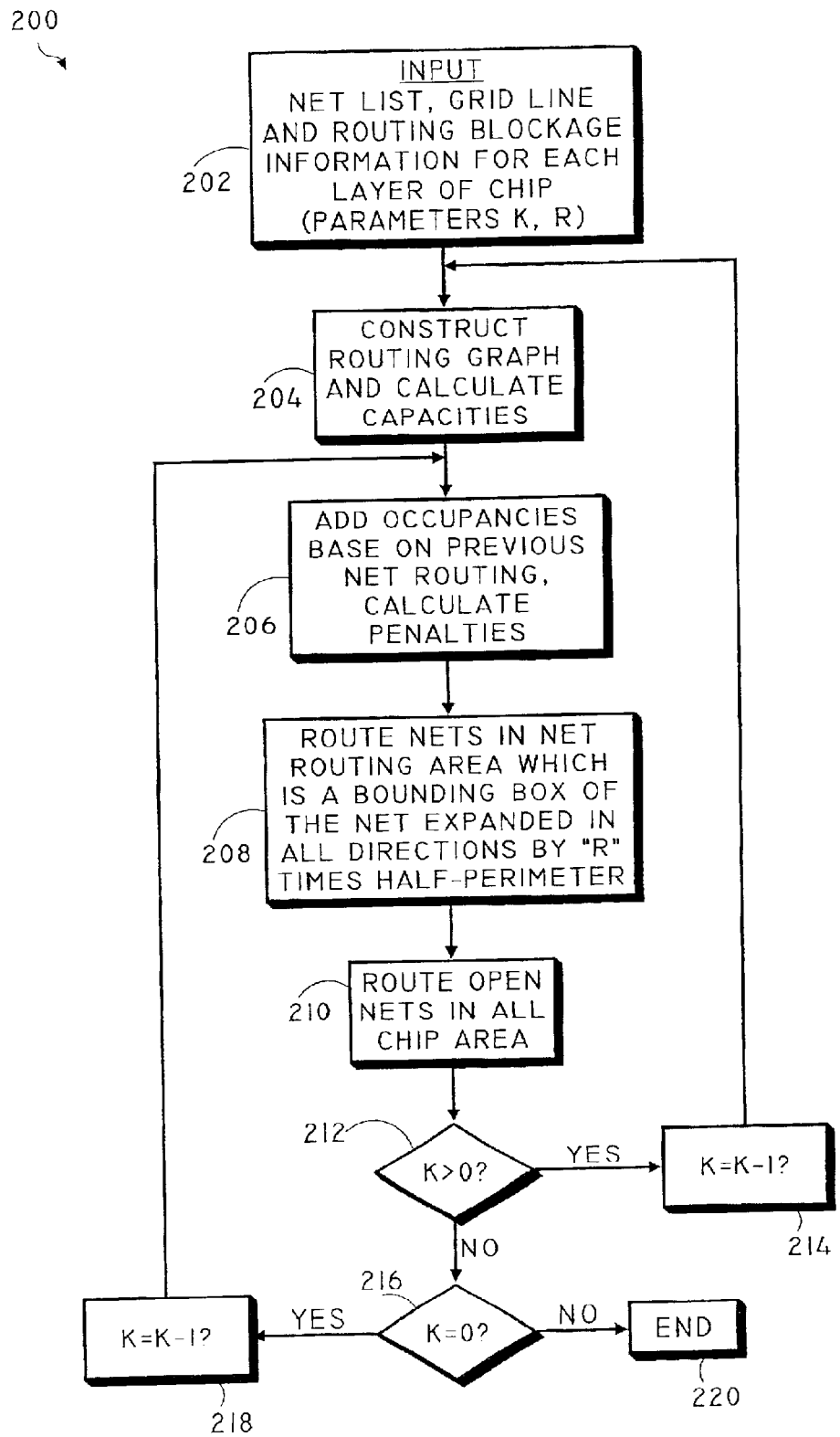
FIG. 2 is a flow diagram of an exemplary method of the present invention wherein a procedure for routing an integrated circuit having multiple layers is shown suitable utilizing any arbitrary angle, the procedure routing nets in both a net routing area and open nets outside the net routing area.

Referring now to FIG. 2, an exemplary method 200 of the present invention is shown wherein steps of a multidirectional router are presented. As an initializing step 202, a netlist, grid lines slope, distance between neighboring grid lines, wire blockage information and other specified parameters k and r as contemplated by a person of ordinary skill in the art are input to the system.

At a first operational step 204, a routing graph is constructed and capacities of edges are calculated. Each layer of the chip may be divided into square sections, which may be referred to as a "tile." One side of each tile of the layer is directed along with the layer grid lines. The size of each tile side is equal to one grid. The grid lines are positioned through the middle of tiles. A middle line of a tile relatively grid line direction, i.e. that part of a grid line inside a tile, may be referred to as a segment. The part of tiles from neighbor layers is called via if segments of these tiles are intersected and these tiles are not covered by the routing blockages.

Each layer of the chip is partitioned into square sections called k-level tiles. The size of each k-level tile may be equal to $2^k$ grids and each k-level tile may include $2^{2k}$ tiles or four (k−1)-level tiles. Each of these k-level tiles may be considered a vertex in a k-level routing graph. Two k-level tiles of one layer are joined by the edge in the k-level routing graph if these tiles are neighbor relatively grid line direction. Such edges connecting two vertices from one layer are called regular. Two k-level tiles from neighbor layers are joined by the edge in the k-level routing graph if pair of these tiles is connected by a via, such edges connecting two vertices from neighbor layers are called normal.

Thus, for input parameter k, which is usually five, but may vary without departing from the present invention, a k-level routing graph is constructed. For each edge of the k-level routing graph, a capacity may be calculated as follows: For each regular edge, the capacity is the height of the corresponding tile expressed in grids, which may be equal to $2^k$ grids, minus the number of grids covered by routing blockages; for each normal edge, the capacity is the half of the number of vias contained in these tiles. The number of vias is divided by 2, because real vias in the chip should not be placed in neighbor 0-level tiles in an embodiment of the present invention.

As a second operational step 206, occupancies are added based on previous level ((k+1)-level) net routing and penalties of edges are calculated. For instance, for the first time, i.e. an initial k, this step may be fictitious and occupancies are set of all edges of k-level routing graph to zero. Beginning with the second time when there is (k+1)-level net routing, for each edge of k-level routing graph, occupancy may be calculated as follows. All routed nets of netlist and all edges of (k+1)-level routing of these nets are considered.

Figure 3A:
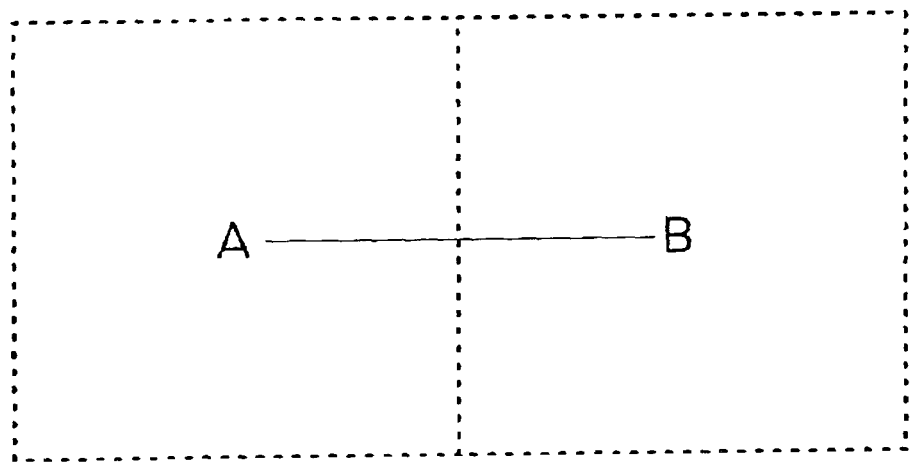
FIG. 3A is an illustration of an embodiment of the present invention wherein a regular edge of previous level routing of a net is shown.
Figure 3B:
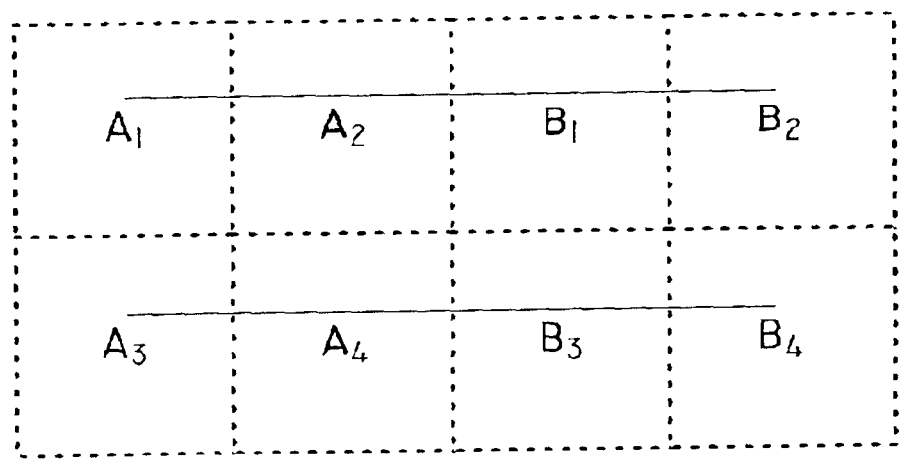
FIG. 3B is an illustration of an embodiment of the present invention wherein a current level includes four vertices, denoted with subscripts 1, 2, 3 and 4, corresponding to each of the previous level vertices.

For example, as shown in FIG. 3A, an example of such a regular edge of previous level routing of a net is shown. The tiles are presented by dashed lines and the edge is shown by a solid line. On the previous level, vertices A and B are provided. On the current level, shown in FIG. 3B, four vertices, denoted with subscripts 1, 2, 3 and 4, correspond to each of the previous level vertices. Suppose that C is the capacity of the edge connecting the vertices A and B, the edge may be denoted by (A B). $C_1$ is the capacity of the edge ($A_2$ $B_1$), and $C_2$ is the capacity of the edge ($A_4$ $B_3$). Thus, $C=C_1+C_2$, and therefore ($C_1/C$), ($C_1/2C$), ($C_2/C$), ($C_2/2C$) and ($C_2/2C$) is added to occupancy of edges ($A_2$ $B_1$), ($A_1$ $A_2$), ($B_1$ $B_2$), ($A_4$ $B_3$), ($A_3$ $A_4$) and ($B_3$ $B_4$) accordingly.

Figure 4A:
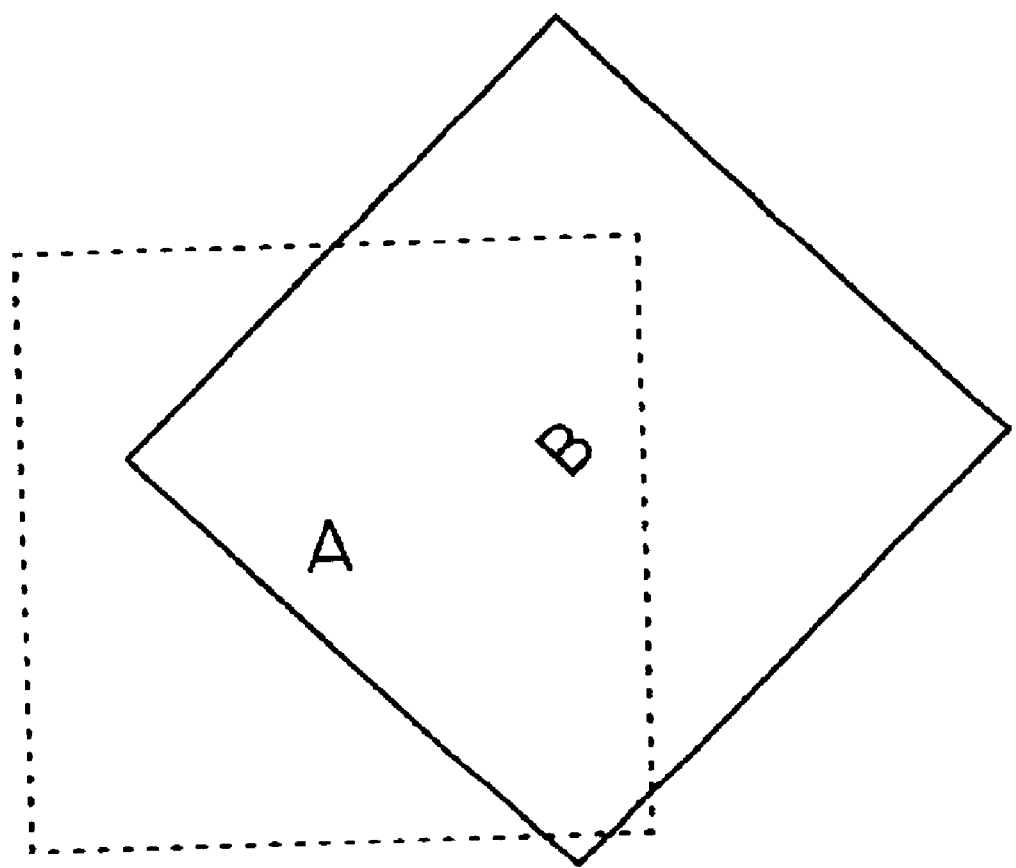
FIGS. 4A and 4B are a depictions of an embodiment of the present invention wherein normal edges connecting vertices from neighbor layers are shown.
Figure 4B:
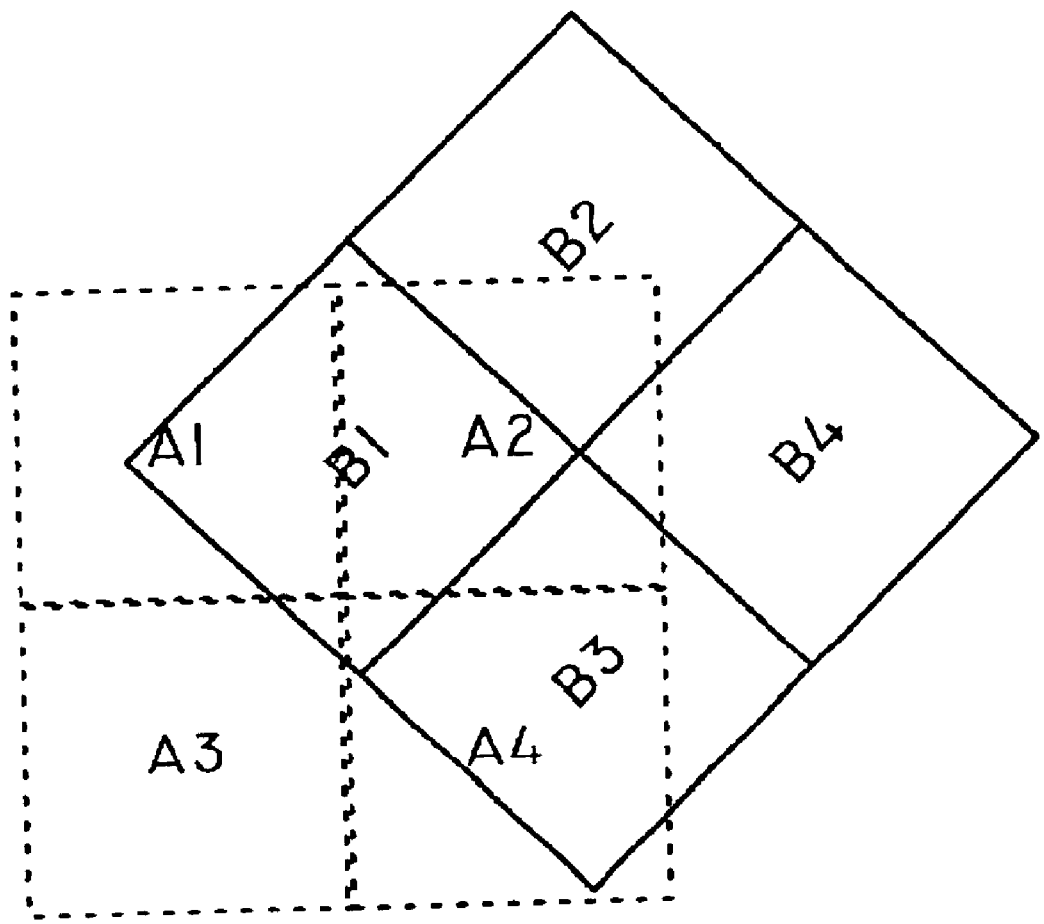

The normal edges connecting vertices from neighbor layers are shown on FIGS. 4A and 4B. For instance, let m and m+1 be numbers of these neighbor layers. The tiles of layer m are presented by dashed lines and the tiles of layer m+1 by solid lines. On the previous level, vertices A (belonging to layer m) and B (belonging to layer m+1) are provided. On the current level, which is shown in FIG. 4B, four vertices, denoted with subscripts 1, 2, 3 and 4, correspond to each of the previous level vertices.

Suppose the edge (A B) belongs to the previous level routing of some net. On the current level, the edges ($A_1$ $B_1$), ($A_2$ $B_1$), ($A_2$ $B_2$), ($A_2$ $B_3$), ($A_2$ $B_4$), ($A_3$ $B_1$), ($A_1$ $B_3$) appear instead of the edge (A B). Let $C_{ij}$ be a capacity of the edge ($A_i$ $B_j$). Denote $C=C_{11}+C_{21}+C_{22}+C_{23}+C_{24}+C_{31}+C_{41}+C_{43}$. It should be noted that the capacity of the edge (A B) is equal to C. Next, $C_{11}/C$, $C_{21}/C$, $C_{22}/C$, $C_{23}/C$, $C_{24}/C$, $C_{31}/C$, $C_{41}/C$, $C_{43}/C$ are added to the occupancy of the edges ($A_1$ $B_1$), ($A_2$ $B_1$), ($A_2$ $B_2$), ($A_2$ $B_3$), ($A_2$ $B_4$), ($A_3$ $B_1$), ($A_1$ $B_3$) accordingly. FIG. 2 shows that last time, when k=−1, the routing graph was not constructed. Therefore, when k=−1, the edge occupancies are increased as follows. If some edge belongs to the previous routing of some net then 1 is added to its occupancy.

The penalty for passing through an edge may be a function of the quotient occupancy/capacity and of the length of the edge. For example, the penalty may be 5(occupancy/capacity)length+length. This penalty function may vary although it is preferred that the penalty increase as a function of occupancy/capacity and that the penalty further increases as a function of length. For instance, the penalty may also be calculated as follows: length•$e^{occupancy/capacity}$+length.

Figure 5:
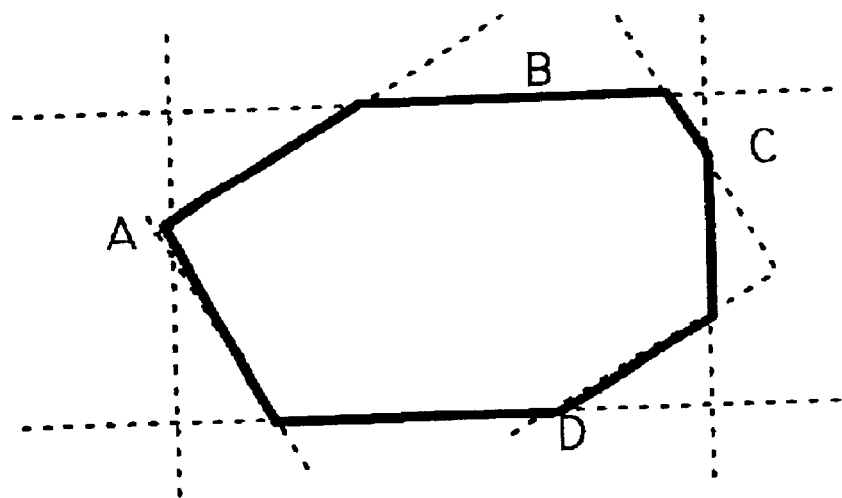
FIG. 5 is an illustration of an embodiment of the present invention wherein a net including four pins, A, B, C and D and grid line directions of 4 layers of the chip are presented by lines OX, OY, OZ and OU as utilized to define a bounding box is shown.
Figure 5:
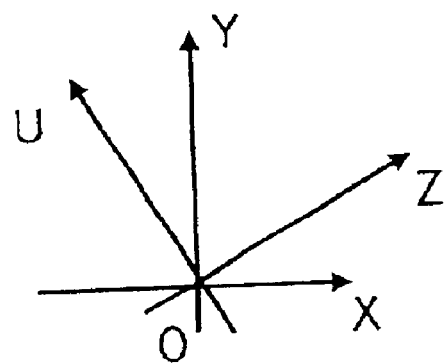

The third operational step 206 (FIG. 2) is to route the nets in the net routing area. A net routing area is an area based on the net such that the routing of this net, which will be constructed, must be located into this area. There are many ways in which to construct the net routing area. One way is to construct a bounding box based on x and y coordinates and then expand it in all four direction by r times hp, where r is the input parameter and is usually ⅓, hp is half-perimeter of the bounding box. A generalized bounding box of the net may also be constructed based on the grid line directions of all the chip layers. FIG. 5 depicts a net including four pins, A, B, C and D. The grid line directions of 4 layers of the chip are presented by lines OX, OY, OZ and OU. The generalized bounding box of the net A, B, C and D is presented by solid lines. After construction of the generalized bounding box, it may be expanded in all directions by r times hp.

Nets may be routed utilizing a variety of methods, such as the method described in U.S. Pat. No. 6,175,950, which is herein incorporated by reference in its entirety, and other methods as contemplated by a person of ordinary skill in the art. For instance, nets may also be routed by examining all nets step by step. If an examined net has previous routing then the occupancies of the routing graph edges are decreased in the analogical manner as occupancies are added based on previous net routing in operation step 208. Penalties of the changed edges are then recalculated, and the examined net is routed, such as the method that will be described subsequently. Then, once the net is routed, the edges are examined which belong to the routing of this net and for each edge, one (1) is added to its occupancy and its penalty recalculated.

At the net operational step 210 (FIG. 2), nets, which were not routed in step 208, are routed in all chip area. If k>zero (0) 212, the first 204, second 206, third 208 and fourth 210 operational steps are repeated after one is subtracted from k 214. If k is equal to zero 216, the second 206, third 208 and fourth 210 operational steps are repeated after one is subtracted from k 218. This step may be provided because in some instances, vias may be placed in neighbor 0-level tiles after previous net routing. As discussed previously, when k=−1 execution of operational steps two 206 and three 208 is different from the case of when k≧0, too. In the case of k=−1, if some normal edge is added to routing of some net, then all neighbor normal edges are excluded from use for net routing. If k is less than zero 220, legal net routing is obtained.

Procedure to Route Net

A "net" may include a set of pins. In a chip, a pin is a set of points, a set of points and wires connecting these points, and the like. In the present discussion, a pin will be considered as a set of vertices of the routing graph and a vertex is included to the pin if pin's and wires are intersected with the tile corresponding to the vertex. Pins $P_1$ and $P_2$ are directly connected by set E of the edges if $P_1 \cap P_2 = 0$ or there are vertices $a_1 \in P_1$ and $a_2 \in P_2$ such that there exists a path consisting from edges from E and connecting the vertices $a_1$ and $a_2$. Pins $P_1$ and $P_2$ are connected by set E of the edges if there are pins $P_3, \ldots, P_n$ such that $P_1$ and $P_3$, are $P_i$ and $P_{i+1}$ (i=3, 4, ..., n−1), $P_n$ and $P_2$ are directly connected by set E. A routing of a net is a set E of edges of routing graph such that any two different pins of the net are connected by the set E.

The input of Procedure to Route Net is a net, the output is a routing of this net. If the input net consists from 2 pins, the neighborhood of the first pin is grown until it is intersected with the second pin. A procedure to grow neighborhoods is described later in the discussion. Then, proceeding backward, the least-penalty path is chosen from one pin to another, which will also be discussed subsequently.

If the input net includes 3 pins, $P_1$, $P_2$ and $P_3$ the neighborhoods of all pins are grown until a vertex is reached in another pin. If there is a vertex in the intersection of all neighborhoods, the sum of penalties of all three pins are found from that vertex. In other words, a vertex $P_0$ for which that sum is minimal is found. That sum is denoted by $Pen_0$. Then, for each $P_I$ (I=1, 2, 3), the sum of penalties to other two pins is found from the pin P, and that sum is denoted by $Pen_I$. If $Pen_0 = min\{Pen_i, i=0, 1, 2, 3\}$ then the net routing is the union of the three least-penalty paths from $P_0$ to all pins $P_1$, $P_2$ and $P_3$. If, for example, $Pen_1 == min\{Pen_i, i=0, 1, 2, 3\}$ then the net routing is the union of the two paths from $P_1$ to pins $P_2$ and $P_3$.

If the number of pins in the input net is more than 3, than the net may be partitioned into 2 subnets. For example, the method described in U.S. Pat. No. 6,175,950 may be applied, which is herein incorporated by reference in its entirety. For instance, for each pin, the center of gravity may be calculated, and then the pins sorted in ascending order of abscissae of the center of gravity. Let $\{x_1, \ldots, x_n\}$ be the ordering set of abscissae. $x_m$ is found such that $x_{m+1} - x_m = \max\{x_{I+1} - x_I, i=1, 2, \ldots, n-1\}$. The point $x_m$ divides net into 2 subnets. The first subnet includes from m first pins and the second subnet contains another pins. Analogical actions relative to ordinates may also be performed.

After partitioning the net $\{P_1, \ldots, P_n\}$ into 2 subnets $\{P_1, \ldots, P_m\}$ and $\{P_{m+1}, \ldots, P_n\}$, the neighborhoods of the following set:

$$\bigcup_{i=1}^{m} P_1$$

and may be grown until a vertex from the following set is reached:

$$\bigcup_{i=m+1}^{n} P_1$$

Then, going backward, the least-penalty path from one set to another is chosen and this path is included in the routing of the net. Then, the Procedure to Route Net is recursively applied to the nets $\{P_1, \ldots, P_m\}$ and $\{P_{m+1}, \ldots, P_n\}$.

Procedure to Grow Neighborhoods

Let V be the set of vertices of the routing graph and |V|=VertexNumber. Suppose the vertices of the routing graph are numerated from 1 to VertexNumber and N(a) is the number of a vertex a. An edge connecting vertices a and b is denoted by (a,b). Pen(a,b) is the penalty of the edge (a,b). If Pen(a,b)=∞, then edge (a,b) is not used for routing. Vertices a and b are referred to as a neighbor if there is edge (a, b) in the routing graph. A sequence of edges $(a,a_1)$, $(a_1,a_2), \ldots, (a_{n-1}, a_n), (a_n,b)$ is called a path connecting vertices a and b. The penalty of a path P is the sum of penalties of all edges of the path, and is denoted by Pen(P). The distance between vertices a and b is the minimum of penalties of the paths connecting vertices a and b, which is denoted as Dist(a,b). If there are no paths connecting vertices a and b, then Dist(a,b)=∞. If A,B⊆V, a∈V, then Dist(A,a)=min{Dist(b,a), b∈A}, Dist(A,B)=min{Dist(A,a), a∈B}. If A⊆V then neighborhood of the set A is the set $M_t(A)=\{a \in V, Dist(A,a) \leq t\}$.

The input of Procedure to Grow neighborhoods is the set Sour of vertices of the routing graph, which may be referred to as a source set, and a set Dest⊆V, referred to as a destination set. The output of Procedure to Grow neighborhoods is the number d=Dist(Sour,Dest), the set $M_d$(Sour), a vertex last∈$M_d$(Sour)∩Dest and the array Prev[VertexNumber], where Prev[N(a)]=0 $M_d$(Sour)\Sour and Prev[N(a)]=b otherwise, where (b,a) is the last edge in a least-penalty path connecting the set Sour and the vertex a.

The procedure may use auxiliary array Char[VertexNumber] and Char[N(a)]=1 if a vertex a belongs to current neighborhood, and Char[N(a)]=0 otherwise; and two sequence of lists $L_1, L_2, L_3, \ldots$, and $P_1, P_2, P_3, \ldots$, where $L_t$ is a list of vertices and each $L_t$[i] is a candidate to t-neighborhood of the set Sour (i.e. Dist($L_t$[i],Sour)≦t), $P_t$ is a list of vertices, and ($P_t$[i], $L_t$[i]) is the last edge in a path Q such that Q connects the set Sour and the vertex $L_t$[i], and Pen(Q)=t.

In an embodiment of the invention, when the procedure is started, Char[k]=0, Prev[k]=0 for all k and the lists $L_t$, $P_t$ are empty for all t. The procedure to grow neighborhoods may include the following steps.

For all a∈Sour, set Char[N(a)]=1. Set d=0, d is the radius of the current neighborhood, $d_{max}$=0, $M_0$(Sour)=Sour.

For all a∈Dest, Char[N(a)] is checked. If Char[N(a)]=1 (it means that a∈$M_d$(Sour)), then last is set equal to a and return d, $M_d$(Sour), last, and the array Prev as the results of the procedure.

All vertices of the set $M_d$(Sour) $M_{d-1}$(Sour) are examined step by step. For each vertex a∈$M_d$(Sour)$M_{d-1}$(Sour), all neighbor vertices are examined step by step. For each vertex b which is a neighbor of the vetex a, if Char[N(b)]=0 and p=Pen(b,a)<∞, then a is added to the list $L_{d+p}$ and b to the list $P_{d+p}$, and if d+p>$d_{max}$, $d_{max}$ is set equal to d+p.

Next, $M_{d+1}$(Sour) is set equal to $M_d$(Sour). All vertices of the list $L_{d+1}$ are examined step by step. For each vertex a=$L_{d+1}$[i], Char[N(a)] is checked. If Char[N(a)]=0, then the vertex a is added to the set $M_{d+1}$(Sour), set Char[N(a)]=1, Prev[N(a)]=$P_{d+1}$[i].

Then, d is set equal to d+1. If d≦$d_{max}$, then the procedure returns to step 2. If d>$d_{max}$, it means that there is not a path connecting the sets Sour and Dest, and therefore the procedure is exited.

Finally, if d=Dist(Sour,Dest), last∈$M_d$(Sour)∩Dest then to restore a least-penalty path connecting the sets Sour and Dest, suppose a=last, b=Prev[N(a)]. While b≠0, the edge (a,b) is added to the path and set a=b, b=Prev[N(a)].

In exemplary embodiments, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

Although the invention has been described with a certain degree of particularity, it should be recognized that elements thereof may be altered by persons skilled in the art without departing from the spirit and scope of the invention. One of the embodiments of the invention can be implemented as sets of instructions resident in the memory of one or more information handling systems, which may include memory for storing a program of instructions and a processor for performing the program of instruction, wherein the program of instructions configures the processor and information handling system. Until required by the information handling system, the set of instructions may be stored in another readable memory device, for example in a hard disk drive or in a removable medium such as an optical disc for utilization in a CD-ROM drive and/or digital video disc (DVD) drive, a compact disc such as a compact disc-rewriteable (CD-RW), compact disc-recordable and erasable; a floppy disk for utilization in a floppy disk drive; a floppy/optical disc for utilization in a floppy/optical drive; a memory card such as a memory stick, personal computer memory card for utilization in a personal computer card slot, and the like. Further, the set of instructions can be stored in the memory of an information handling system and transmitted over a local area network or a wide area network, such as the Internet, when desired by the user.

Additionally, the instructions may be transmitted over a network in the form of an applet that is interpreted or compiled after transmission to the computer system rather than prior to transmission. One skilled in the art would appreciate that the physical storage of the sets of instructions or applets physically changes the medium upon which it is stored electrically, magnetically, chemically, physically, optically or holographically so that the medium carries computer readable information.

It is believed that the methodology of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A method for routing a multi-layered integrated circuit, comprising:

receiving parameters for an integrated circuit having n layers, wherein n is at least two;

constructing a routing graph for a level k of the n layers of the integrated circuit, the k level partitioned into k-level tiles, wherein at least one edge is provided to join a first tile and a second tile in the k level routing graph;

calculating capacities of the at least one edge joining the first tile and the second tile, the edge at least one of regular and normal;

adding occupancies based on previous level net routing (k+1) and calculating penalties of edges; and routing nets based on the routing graph, calculated capacities and added occupancies.

2. The method as described in claim 1, wherein after routing nets, if k is more than zero, the constructing, calculating, adding and routing steps are repeated after subtracting one from k.

3. The method as described in claim 1, wherein after routing nets, if k is equal to zero, the adding and routing steps are repeated after subtracting one from k.

4. The method as described in claim 1, wherein after routing nets, if k is less than zero, legal net routing is obtained.

5. The method as described in claim 1, wherein routing nets includes routing nets in a net routing area and routing open nets in all integrated circuit areas.

6. The method as described in claim 1, wherein the parameters include at least one of netlist, grid lines slop, distance between neighboring grid lines, and wire blockage information.

7. The method as described in claim 6, wherein the parameters include parameter information for n layers of the chip.

8. The method as described in claim 1, wherein a tile is a square section, with one side of each tile of the layer directed along a layer grid line.

9. The method as described in claim 8, wherein a tile is sized so that each tile side is approximately equal to one grid.

10. The method as described in claim 8, wherein grid lines are positioned generally through a middle of a tile.

11. The method as described in claim 1, wherein the routing graph includes a vertex including a tile.

12. The method as described in claim 1, wherein capacity for a regular edge is equal to the height of a tile corresponding to the edge expressed in grids minus the number of grid covered by routing blockages.

13. The method as described in claim 1, wherein capacity for a normal edge is half of the number of vias included in the corresponding tiles.

14. The method as described in claim 1, wherein adding occupancies based on previous level net routing includes if pervious level net routing is not available, occupancies are set to zero.

15. The method as described in claim 1, wherein the penalty for passing through an edge is a function of the quotient occupancy/capacity and of the length of the edge.

16. The method as described in claim 1, wherein the penalty at least one of increases as a function of occupancy/capacity and increases as a function of length.

17. The method as described in claim 16, wherein the penalty is computed as follows length$\cdot e^{occupancy/capacity}$+ length.

18. The method as described in claim 1, wherein routing nets includes arriving at a set of edges such that any two different pins of the net are connected by the set.

19. The method as described in claim 1, wherein routing nets includes implementing a procedure to route nets, wherein the input of the procedure is a net, and the output is a routing of the net.

20. The method as described in claim 19, wherein the procedure to route nets includes if an input net has two pins including a first pin and a second pin, a neighborhood of the first pin is grown until the neighborhood intersects the second pin.

21. The method as described in claim 20, wherein a least-penalty path connecting the first pin and the second pin is chosen.

22. The method as described in claim 20, wherein the procedure to route nets includes if an input net has three pins, the neighborhoods of all pins are grown until a vertex is reached in another pin.

23. The method as described in claim 22, wherein if a vertex in the intersection of all neighborhoods is provided, a sum of penalties to all three pins from that vertex.

24. The method as described in claim 23, wherein there is a vertex in the intersection of all neighborhoods, the sum of penalties of all three pins are found from that vertex such that a vertex $P_0$ for which that sum is minimal is found, and is denoted by $Pen_0$, then, for each $P_i(i=1, 2, 3)$, the sum of penalties to other two pins is found from the pin P, and that sum is denoted by $Pen_i$, so that if $Pen_0=\min\{Pen_i, i=0, 1, 2, 3\}$ then the net routing is the union of the three least-penalty paths from $P_0$ to all pins $P_1$, $P_2$ and $P_3$, if $Pen_1==\min\{Pen_i, i=0, 1, 2, 3\}$ then the net routing is the union of the two paths from $P_1$ to pins $P_2$ and $P_3$.

25. The method as described in claim 20, wherein the procedure to route nets includes more than three pins, the net is partitioned into at least two subnets.

26. The method as described in claim 25, wherein for each pin, a center of gravity is calculated and then the pins are sorted in ascending order of abscissae of the center of gravity, such as let $\{x_1, \ldots, x_n\}$ be the ordering set of abscissae, $X_m$ is found such that $X_{m+1}-X_m=\max\{x_{i+1}-X_i, i=1, 2, \ldots n-1\}$, the point $X_m$ divides net into 2 subnets wherein the first subnet includes from m first pins and the second subnet contains another pins.

27. The method as described in claim 26, wherein the net $\{P_1, \ldots, P_n\}$ is portioned into 2 subnets $\{P_1, \ldots, P_m\}$ and $\{P_{m+1}, \ldots, P_n\}$, the neighborhoods of the following set:

$$\bigcup_{i=1}^{m} P_i$$

and may be grown until a vertex from the following set is reached:

$$\bigcup_{i=m+1}^{n} p_i$$

the least-penalty path from one set to another is chosen and this path is included in the routing of the net, after which, a Procedure to Route Net is recursively applied to the subnets $\{P_1, \ldots, P_m\}$ and $\{P_{m+1}, \ldots, P_n\}$, the procedure based on the number of pins included in the subnets.

28. The method as described in claim 1, wherein routing nets includes implementing a procedure to grow neighborhoods.

29. The method as described in claim 28, wherein the input of the procedure to grow neighborhoods is a set Sour of vertices of the routing graph, which may be referred to as a source set, and a set Dest⊆V, referred to as a destination set, the output of Procedure to Grow neighborhoods includes a number d=Dist(Sour,Dest), set $M_d$(Sour), a vertex last ∈$M_d$(Sour) ∩Dest and the array Prev[VertexNumber], where Prev[N(a)]=0 if a ∉$M_d$(Sour)/Sour and Prev[N(a)]=b otherwise, where (b,a) is the last edge in a least-penalty path connecting the set Sour and the vertex a.

30. A method for routing a multi-layered integrated circuit wherein arbitrary routing directions are supported on an arbitrary number of layers of the integrated circuit, comprising:

receiving parameters for an integrated circuit having n layers, wherein n is at least two;

constructing a routing graph for layers of the integrated circuit, the levels partitioned into tiles, wherein at least one edge is provided to join a first tile and a second tile in the routing graph, the tiles positioned generally corresponding to a layer grid line of the level; and routing based on the routing graph, wherein the plane of the layer is divided by parallel lines (y $\cos\alpha_i$)+(x $\sin\alpha_i$)=j $d_i$, j=0, ±1, ±2, ..., where $\alpha_i$ is an inclination of the lines, $d_i$ is the distance between neighboring lines.

* * * * *